United States Patent
Park et al.

(10) Patent No.: US 9,614,147 B2
(45) Date of Patent: Apr. 4, 2017

(54) HYBRID SYNTHETIC ANTIFERROMAGNETIC LAYER FOR PERPENDICULAR MAGNETIC TUNNEL JUNCTION (MTJ)

(71) Applicant: QUALCOMM Incorporated, San Diego, CA (US)

(72) Inventors: Chando Park, San Diego, CA (US); Kangho Lee, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/169,603

(22) Filed: May 31, 2016

(65) Prior Publication Data

US 2016/0276581 A1   Sep. 22, 2016

Related U.S. Application Data

(62) Division of application No. 14/109,234, filed on Dec. 17, 2013, now Pat. No. 9,379,314.

(51) Int. Cl.
| | |
|---|---|
| *H01L 43/10* | (2006.01) |
| *H01L 43/12* | (2006.01) |
| *H01L 43/08* | (2006.01) |
| *G11C 11/16* | (2006.01) |
| *H01L 43/02* | (2006.01) |

(52) U.S. Cl.
CPC ............ *H01L 43/10* (2013.01); *G11C 11/161* (2013.01); *H01L 43/02* (2013.01); *H01L 43/08* (2013.01); *H01L 43/12* (2013.01)

(58) Field of Classification Search
CPC ......... H01L 43/12; H01L 43/10; H01L 43/08; H01L 43/02
See application file for complete search history.

(56) References Cited

U.S. PATENT DOCUMENTS

| 7,948,044 B2 | 5/2011 | Horng et al. |
|---|---|---|
| 2012/0063218 A1 | 3/2012 | Huai et al. |

(Continued)

FOREIGN PATENT DOCUMENTS

| JP | 2013187409 A | 9/2013 |
|---|---|---|
| JP | 2014072392 A | 4/2014 |

OTHER PUBLICATIONS

International Search Report and Written Opinion—PCT/US2014/066447—ISA/EPO—Apr. 17, 2015.

(Continued)

*Primary Examiner* — Douglas Menz
(74) *Attorney, Agent, or Firm* — Seyfarth Shaw LLP

(57) ABSTRACT

A magnetic tunnel junction (MTJ) device includes a free layer. The MTJ also includes a barrier layer coupled to the free layer. The MTJ also has a fixed layer, coupled to the barrier layer. The fixed layer includes a first synthetic antiferromagnetic (SAF) multilayer having a first perpendicular magnetic anisotropy (PMA) and a first damping constant. The fixed layer also includes a second SAF multilayer having a second perpendicular magnetic anisotropy (PMA) and a second damping constant lower than the first damping constant. The first SAF multilayer is closer to the barrier layer than the second SAF multilayer. The fixed layer also includes a SAF coupling layer between the first and the second SAF multilayers.

20 Claims, 6 Drawing Sheets

(56) References Cited

U.S. PATENT DOCUMENTS

| | | |
|---|---|---|
| 2013/0075845 A1 | 3/2013 | Chen et al. |
| 2013/0078482 A1 | 3/2013 | Shukh |
| 2013/0119498 A1 | 5/2013 | Huai et al. |
| 2013/0224521 A1 | 8/2013 | Wang et al. |
| 2015/0171316 A1 | 6/2015 | Park et al. |

OTHER PUBLICATIONS

Kato T., et al., "Perpendicular Anisotropy and Gilbert Damping in Sputtered Co/Pd Multilayers," IEEE Transactions on Magnetics, Nov. 2012, vol. 48, No. 11, pp. 3288-3291.

Kato T., et al., "Time-Resolved Magnetization Dynamics and Damping Constant of Sputtered Co/Ni Multilayers," IEEE Transactions on Magnetics, Oct. 2011, vol. 47, No. 10, pp. 3036-3039.

HYBRID SYNTHETIC ANTIFERROMAGNETIC LAYER FOR PERPENDICULAR MAGNETIC TUNNEL JUNCTION (MTJ)

CROSS-REFERENCE TO RELATED APPLICATION

The present application is a divisional of U.S. patent application Ser. No. 14/109,234, filed on Dec. 17, 2013, and entitled "HYBRID SYNTHETIC ANTIFERROMAGNETIC LAYER FOR PERPENDICULAR MAGNETIC TUNNEL JUNCTION (MTJ)," the disclosure of which is expressly incorporated by reference herein in its entirety.

BACKGROUND

Field

Aspects of the present disclosure relate to semiconductor devices, and more particularly to a hybrid synthetic antiferromagnetic (SAF) layer for perpendicular magnetic tunnel junction (pMTJ) devices.

Background

Unlike conventional random access memory (RAM) chip technologies, in magnetic RAM (MRAM) data is stored by magnetic polarization of storage elements. The storage elements are formed from two ferromagnetic layers separated by a tunneling layer. One of the two ferromagnetic layers, which is referred to as the fixed (e.g., pinned) layer, has a magnetization that is fixed in a particular direction. The other ferromagnetic magnetic layer, which is referred to as the free layer, has a magnetization direction that can be altered to two different states. One such device having a fixed layer, a tunneling layer, and a free layer is a magnetic tunnel junction (MTJ).

In an MTJ, the different states of the free layer may be used to represent either a logic "1" or a logic "0". In particular, the electrical resistance of an MTJ depends on whether the free layer magnetization and fixed layer magnetization are parallel or anti-parallel with each other. For example, a logic "1" state is represented when the free layer magnetization is anti-parallel to the fixed layer magnetization. A logic "0" state is represented when the free layer magnetization is parallel to the fixed layer magnetization. A memory device such as MRAM is built from an array of individually addressable MTJs.

To write data in a conventional MRAM, a write current exceeding a critical switching current is applied through an MTJ. The write current should exceed the switching current by a sufficient amount to change the magnetization direction of the free layer. When the write current flows in a first direction, the MTJ is placed into or remains in a first state. In the first state, a free layer magnetization direction and a fixed layer magnetization direction of the MTJ are aligned in a parallel orientation. When the write current flows in a second direction, opposite to the first direction, the MTJ is placed into or remains in a second state. In the second state, the free layer magnetization and fixed layer magnetization of the MTJ are in an anti-parallel orientation.

SUMMARY

A magnetic tunnel junction (MTJ) device in accordance with an aspect of the present disclosure includes a free layer. The MTJ also includes a free layer and a barrier layer coupled to the free layer. The MTJ also includes a fixed layer, coupled to the barrier layer. The fixed layer includes a first synthetic antiferromagnetic (SAF) multilayer having a first perpendicular magnetic anisotropy (PMA) and a first damping constant. The fixed layer also includes a second SAF multilayer having a second perpendicular magnetic anisotropy (PMA) and a second damping constant lower than the first damping constant. The first SAF multilayer is closer to the barrier layer than the second SAF multilayer. The fixed layer also includes a SAF coupling layer between the first and the second SAF multilayers.

A method of fabricating a magnetic tunnel junction (MTJ) device in accordance with another aspect of the present disclosure includes depositing a first synthetic antiferromagnetic (SAF) multilayer having a first perpendicular magnetic anisotropy (PMA) and a first damping constant. The method further includes depositing a SAF coupling layer on the first SAF multilayer. The method also includes depositing a second SAF multilayer having a second perpendicular magnetic anisotropy (PMA) and a second damping constant lower than the first damping constant. The method also includes depositing a barrier layer on the second SAF multilayer. The method further includes depositing a free layer on the barrier layer.

A magnetic tunnel junction (MTJ) device in accordance with another aspect of the present disclosure includes a free layer, a barrier layer, and a fixed layer. The fixed layer includes means for providing a first perpendicular magnetic anisotropy (PMA) and a first damping constant. The fixed layer also includes means for providing a second perpendicular magnetic anisotropy (PMA) and a second damping constant lower than the first damping constant. The first providing means is closer to the barrier layer than the second providing means. The fixed layer also has means for coupling the first and the second providing means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
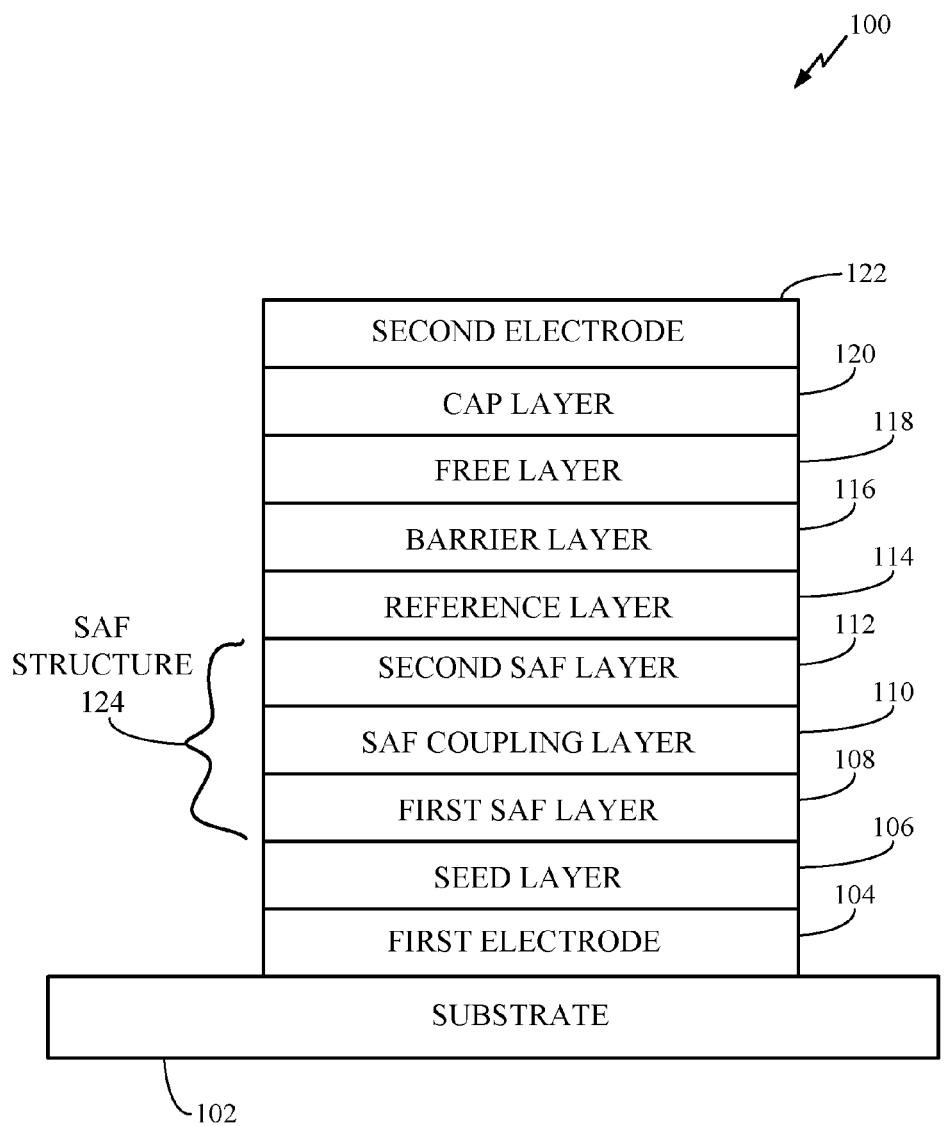
FIG. 1 illustrates a cross-sectional view of a perpendicular magnetic tunnel junction (pMTJ) in accordance with one aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR."

Materials used to form a magnetic tunnel junction (MTJ) of a magnetic random access memory (MRAM) generally exhibit high tunneling magneto resistance (TMR), high perpendicular magnetic anisotropy (PMA) and good data retention. MTJ structures having a perpendicular orientation are referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. A pMTJ structure including a stack of materials (e.g., CoFeB/MgO/CoFeB) has been considered for use in MRAM structures.

A pMTJ may employ a fully perpendicular magnetization of the pinned layers. The perpendicular pinned layers of the pMTJ may be formed using synthetic antiferromagnetic (SAF) layers. The SAF layers of a pMTJ may be formed from a multilayer stack of cobalt/platinum (Co/Pt) or cobalt/nickel (Co/Ni). The perpendicular pinned layers of the pMTJ may not exhibit high magnetic anisotropy, good thermal stability and a low damping constant for improved device performance when formed from a multilayer stack of cobalt/platinum (Co/Pt) or cobalt/nickel (Co/Ni).

For example, perpendicular pinned layers formed from a cobalt/platinum (Co/Pt) multilayer stack show high anisotropy and good thermal stability. The damping constant of a Co/Pt multilayer stack, however, is very high due to the strong spin orbital coupling of Pt. Another candidate for a perpendicular pinned layer is a cobalt/nickel (Co/Ni) multilayer stack.

In a [Co/Pt] multilayer stack, the number of periods of Co/Pt may range from two to thirty, and may often be between four and fifteen. The thickness of a cobalt layer in a [Co/Pt] multilayer stack may range between 1.5 angstroms and 8 angstroms, and the thickness of the platinum layers may range between 1.5 angstroms and 12 angstroms.

In a [Co/Ni] multilayer stack, the number of periods of Co/Ni may range from two to thirty, and may often be between four and fifteen. The thickness of a cobalt layer in a [Co/Ni] multilayer stack may range between 1.5 angstroms and 8 angstroms, and the thickness of the nickel layers may range between 2 angstroms and 10 angstroms. The Co/Ni multilayer stack has a lower damping constant due to the nature of fully ferromagnetic layers, but its magnetic anisotropy is relatively small for use in a pMTJ pinned layer. The desired anisotropy, thermal stability, and damping constant of a perpendicular pinned layer are generally not met with either a Co/Pt multilayer stack or a Co/Ni multilayer stack.

In an aspect of the present disclosure, a magnetic tunnel junction (MTJ) device includes a free layer, a barrier layer and a fixed layer. In one configuration, the fixed layer includes a first synthetic antiferromagnetic (SAF) multilayer having a first perpendicular magnetic anisotropy (PMA) and a first damping constant. The fixed layer also includes a second SAF multilayer having a second perpendicular magnetic anisotropy (PMA) and a second damping constant lower than the first damping constant. The first SAF multilayer may be disposed closer to the barrier layer than the second SAF multilayer. The fixed layer further includes an SAF coupling layer between the first and the second SAF multilayers.

In one configuration, the fixed layer is formed from a cobalt platinum (Co/Pt) multilayer stack that is coupled to a cobalt nickel (Co/Ni) multilayer stack. The Co/Pt multilayer stack may be coupled to the Co/Ni multilayer stack through a ruthenium (Ru) layer (antiferromagnetic coupling) or by direct deposition of the Co/Ni multilayer stack on the Co/Pt multilayer stack. This hybrid Co/Ni—Co/Pt multilayer structure provides a perpendicular MTJ (pMTJ) that exhibits high magnetic anisotropy, good thermal stability, and a lower damping constant, resulting in improved device performance.

FIG. 1 illustrates a cross-sectional view of a perpendicular magnetic tunnel junction (pMTJ) in accordance with one aspect of the present disclosure. Representatively, a pMTJ 100 is formed on a substrate 102. The pMTJ 100 may be formed on a semiconductor substrate, such as silicon substrate, or any other alternative suitable substrate material. The pMTJ 100 may include a first electrode 104, a seed layer 106, a first synthetic antiferromagnetic (SAF) layer 108, a SAF coupling layer 110, and a second SAF layer 112. The pMTJ 100 also includes a reference layer 114, a barrier layer 116, a free layer 118, a cap layer 120 (also known as a capping layer), and a second electrode 122. The pMTJ 100 may be used in various types of devices, such as a semiconductor memory device (e.g., a magnetic random access memory (MRAM)).

In this configuration, the first electrode 104 and the second electrode 122 include conductive materials (e.g., tantalum (Ta)). In other configurations, the first electrode 104 and/or second electrode 122 may include other appropriate materials, including but not limited to platinum (Pt), copper (Cu), gold (Au), aluminum (Al), or other like conductive materials. The first electrode 104 and the second electrode 122 may also use different materials within the pMTJ 100.

A seed layer 106 is formed on the first electrode 104. The seed layer 106 may provide a mechanical and crystalline substrate for the first SAF layer 108. The seed layer 106 may be a compound material, including but not limited to, nickel chromium (NiCr), nickel iron (NiFe), NiFeCr, or other suitable materials for the seed layer 106. When the seed layer 106 is grown or otherwise coupled to the first electrode 104, a smooth and dense crystalline structure results in the seed layer 106. In this configuration, the seed layer 106 promotes growth of subsequently formed layers in the pMTJ 100 according to a specific crystalline orientation. The crystalline structure of the seed layer 106 may be selected to be any crystal orientation within the Miller index notation system, but is often chosen to be in the (111) crystal orientation.

A first SAF layer 108 is formed on the seed layer 106. The first SAF layer 108 may be a single layer of material, or may be a multi-layer stack of materials, which is formed on the seed layer 106. The multi-layer stack of materials used for the first SAF layer 108 may be a ferromagnetic material or a combination of materials to create a ferromagnetic moment in the first SAF layer 108. The multi-layer stack of materials used to form the first SAF layer 108 includes, but is not limited to, cobalt (Co), cobalt in combination with other materials such as nickel (Ni), platinum (Pt), or palladium (Pd), or other like ferromagnetic materials.

An SAF coupling layer 110 is formed on the first SAF layer 108, and promotes magnetic coupling between the first SAF layer 108 and a second SAF layer 112. The SAF coupling layer 110 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 110 may also include materials to provide mechanical and/or crystalline structural support for the first SAF layer 108 and the second SAF layer 112.

The second SAF layer 112 is formed on the SAF coupling layer 110. The second SAF layer 112 may use similar materials as the first SAF layer 108, but may include other materials. The combination of the first SAF layer 108, the SAF coupling layer 110, and the second SAF layer 112 forms a SAF structure 124, which is often referred to as a "pinned layer" in the pMTJ 100. The SAF structure 124 fixes, or pins, the magnetization direction of the SAF structure 124 through anti-ferromagnetic coupling. The SAF structure 124 may include a cobalt-iron-boron (CoFeB) film. The SAF structure 124 may also include other ferromagnetic material layers, such as CoFeTa, NiFe, Co, CoFe, CoPt, CoPd, FePt, or any alloy of Ni, Co and Fe.

A reference layer 114 is formed on the SAF structure 124. The reference layer 114 provides a crystalline orientation for the barrier layer 116. As with the seed layer 106, the material used in the reference layer 114 provides a template for subsequent layers to be grown in a specific crystalline orientation. This orientation may be in any direction within the Miller index system, but is often in the (100) (or (001)) crystal orientation. The reference layer 114 may also be the last layer of the second SAF layer 112, but is shown as a separate layer for ease of explanation.

A barrier layer 116 (also referred to as a tunnel barrier layer) is formed on the reference layer 114. The barrier layer 116 provides a tunnel barrier for electrons travelling between the SAF structure 124 and the free layer 118. The barrier layer 116, which may include magnesium oxide (MgO), is formed on the reference layer 114 and may have a crystalline structure. The crystalline structure of the barrier layer may be in the (100) direction. The barrier layer 116 may include other elements or other materials, such as aluminum oxide (AlO), aluminum nitride (AlN), aluminum oxynitride (AlON), or other non-magnetic or dielectric materials. The thickness of the barrier layer 116 is formed such that electrons can tunnel from the SAF structure 124 through the barrier layer 116 to the free layer 118 when a biasing voltage is applied to the pMTJ 100.

The free layer 118, which may be cobalt-iron-boron (CoFeB), is formed on the barrier layer 116. The free layer 118, when initially deposited on the barrier layer 116, is an amorphous structure. That is, the free layer 118 does not have a crystalline structure when initially deposited on the barrier layer 116. The free layer 118 is also a ferromagnetic layer or multilayer material, which may be the same ferromagnetic material as the SAF structure 124 or may use different materials.

In this configuration, the free layer 118 includes a ferromagnetic material that is not fixed or pinned in a specific magnetic orientation. The magnetization orientation of the free layer 118 is able to rotate to be in a parallel or an anti-parallel direction relative to the pinned magnetization of the SAF structure 124. A tunneling current flows perpendicularly through the barrier layer 116 depending upon the relative magnetization directions of the SAF structure 124 and the free layer 118.

A cap layer 120 is formed on the free layer 118. The cap layer 120 may be a dielectric layer, or other insulating layer, that allows containment of the magnetic and electric fields between the free layer 118 and the SAF structure 124. The cap layer 120 helps reduce the switching current density used to switch the pMTJ 100 from one orientation (e.g., parallel) to the other (e.g., anti-parallel). The cap layer 120, which may also be referred to as a capping layer, may be an oxide, such as, for example, amorphous aluminum oxide (AlOx) or amorphous hafnium oxide (HfOx). The cap layer 120 may also be other materials, such as magnesium oxide (MgO) or other dielectric materials without departing from the scope of the present disclosure.

The second electrode 122 is formed on the cap layer 120. In one configuration, the second electrode 122 includes tantalum. Alternatively, the second electrode 122 includes other suitable conductive material to electrically couple the pMTJ 100 to other devices or portions of a circuit.

In one aspect of the present disclosure, the first SAF layer 108 includes a multilayer stack of alternating cobalt and platinum (Co/Pt) layers. An SAF coupling layer 110 of ruthenium (Ru) may magnetically couple the first SAF layer 108 and the second SAF layer 112. The second SAF layer 112 may include a multilayer stack of alternating cobalt and nickel (Co/Ni) layers. The SAF coupling layer 110 may be placed within the second SAF layer 112 (i.e., within the multilayer Co/Ni stack) for different magnetic coupling of the first SAF layer 108 and the second SAF layer 112 and to control the anisotropy, thermal stability, and damping constant of the SAF structure 124.

Figure 2:
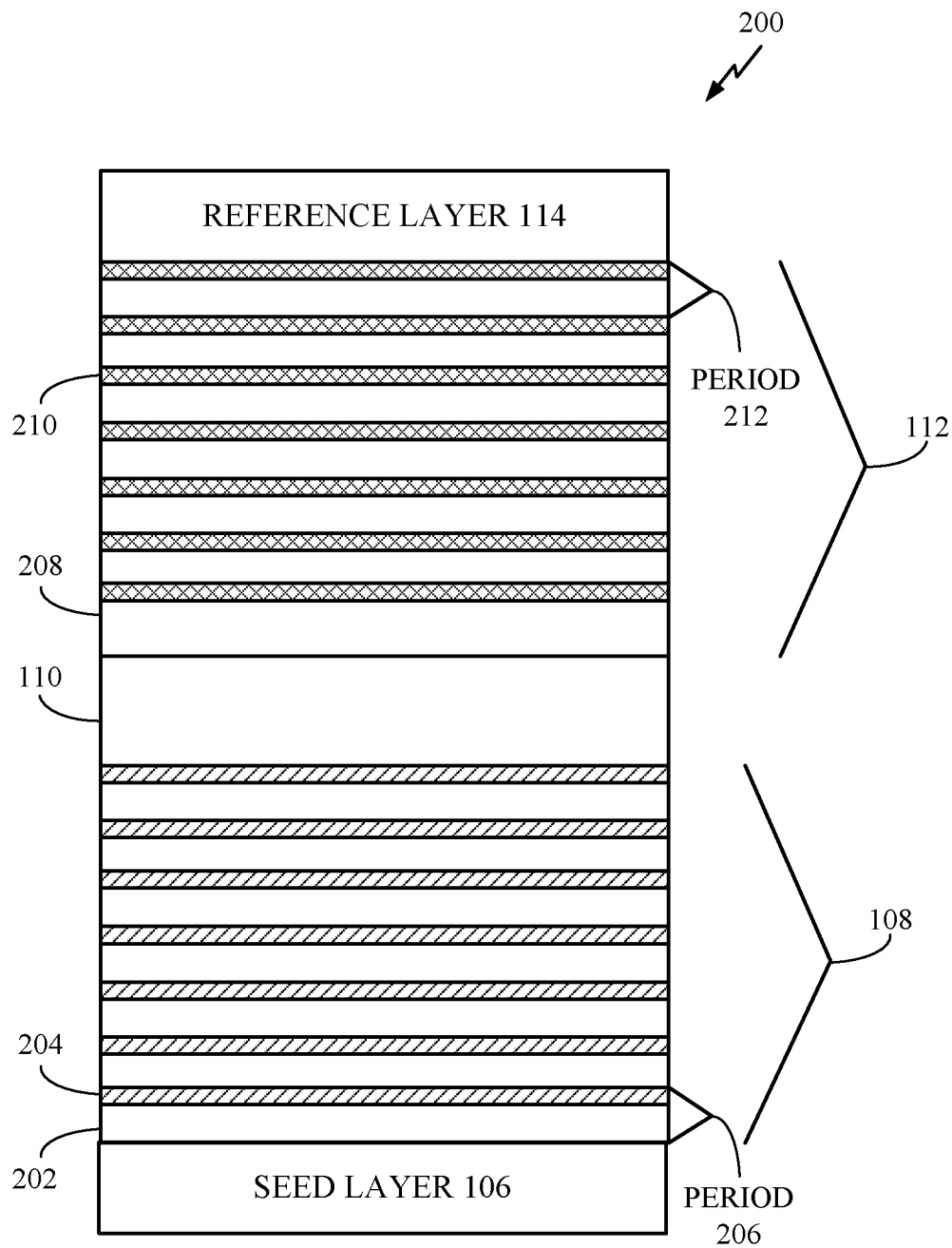
FIG. 2 illustrates a structure in a perpendicular magnetic tunnel junction (pMTJ) in accordance with one or more aspects of the present disclosure.

FIG. 2 illustrates a structure 200 in a pMTJ in accordance with one or more aspects of the present disclosure. Representatively, the first SAF layer 108 is shown as a multilayer stack of materials. Within the first SAF layer 108, a first layer 202 and a second layer 204 are combined in an alternating pattern having a period 206. In one configuration, the first layer 202 is a layer of cobalt and the second layer 204 is a layer of platinum. This configuration includes a first SAF layer 108 of a cobalt-platinum (Co/Pt) multilayer stack. There may be a number "n" of periods 206 of the Co/Pt stack, which is designated as [Co/Pt]n to indicate how many of the periods 206 are used in creating the first SAF layer 108. Other materials may be used for the first layer 202 and the second layer 204 without departing from the scope of the present disclosure.

Similarly, FIG. 2 illustrates the second SAF layer 112 as a multilayer stack of materials. Within the second SAF layer 112, a first layer 208 and a second layer 210 are combined in an alternating pattern having a period 212. In one aspect of the present disclosure, the first layer 208 is a layer of cobalt and the second layer 210 is a layer of nickel. In one example, the second SAF layer 112 is a cobalt-nickel (Co/Ni) multilayer stack. There may be a number "n" of periods 212 of the Co/Ni stack, which is designated as [Co/Ni]n to indicate how many of the periods 212 are used in creating the second SAF layer 112. Other materials may be used for the first layer 208 and the second layer 210 without departing from the scope of the present disclosure. Further, the number of the periods 212 may differ from the number of the periods 206 depending on the overall design of the structure 200, as well as the materials used for the layers 202, 204, 208, 210, and 110.

The SAF coupling layer 110 is placed between the first SAF layer 108 and the second SAF layer 112. The SAF coupling layer 110 aids in the magnetic coupling between the first SAF layer 108 and the second SAF layer 112.

One aspect of the present disclosure provides a specified quality of the first SAF layer 108 (e.g., a higher PMA). By placing a cobalt/platinum (Co/Pt) multilayer stack in the first SAF layer 108, this aspect of the present disclosure incorporates high anisotropy and good thermal stability into the SAF structure 124. Further, by using the Co/Ni stack closer to the barrier layer 116, this aspect of the present disclosure reduces the damping constant of the SAF structure 124. The combination of the different materials within the SAF structure 124 provides an increased magnetic anisotropy as well as a lower damping constant as compared to using either material system exclusively. By combining the use of Co/Pt and Co/Ni multilayer stacks, the magnetic anisotropy, thermal stability, and damping constant may be controlled in a pMTJ 100 device according to this aspect of the present disclosure.

Figure 3:
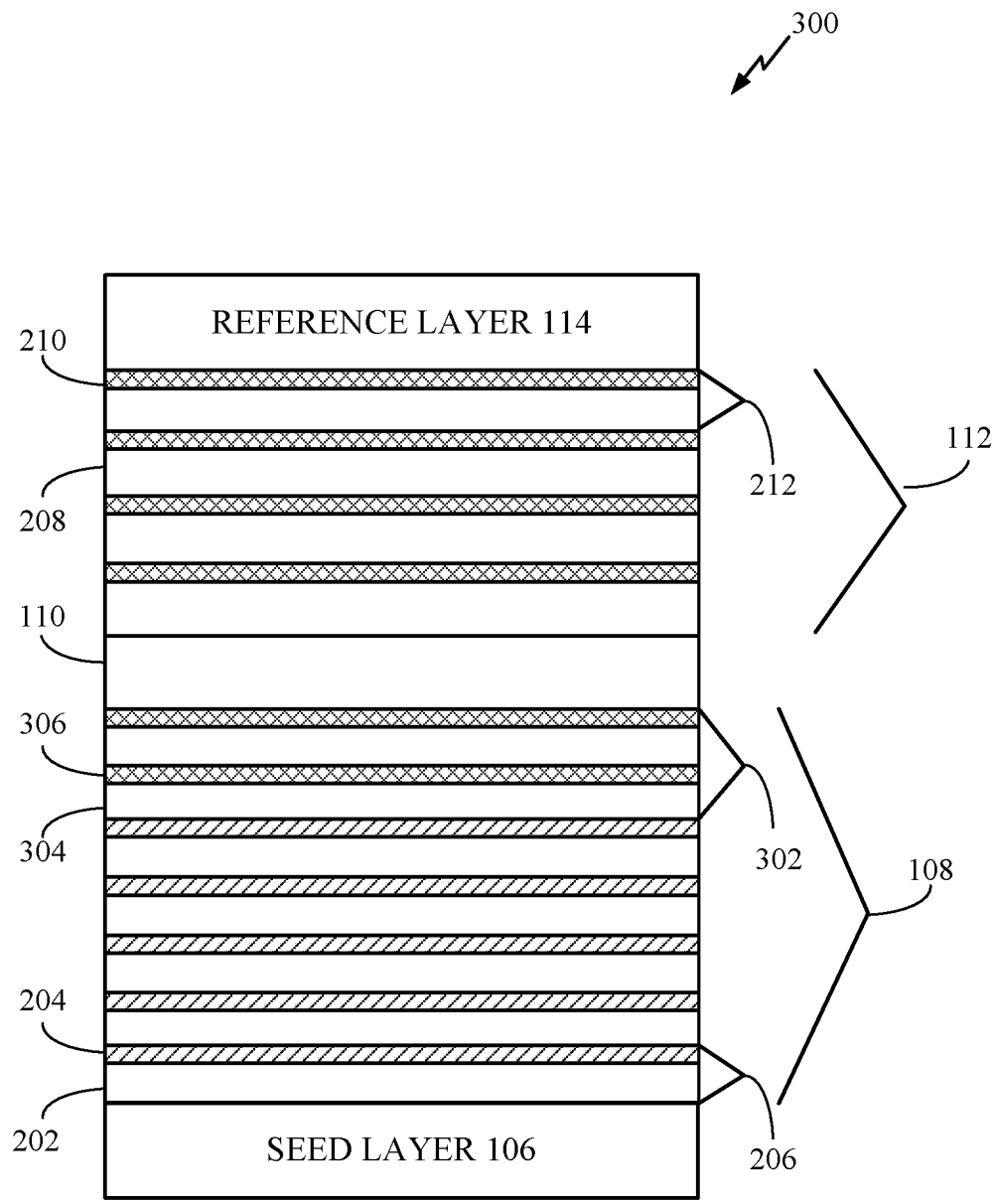
FIG. 3 illustrates a structure within a perpendicular magnetic tunnel junction (pMTJ) in accordance with one or more aspects of the present disclosure.

FIG. 3 illustrates a structure 300 within a pMTJ in accordance with another aspect of the present disclosure. FIG. 3 illustrates that the first SAF layer 108 may comprise additional materials or multilayer stacks other than the Co/Pt multilayer stack of materials shown in FIG. 2. For example, and not by way of limitation, the first SAF layer 108 may include a Co/Pt multilayer stack and a third material 302. The third material 302 may also be a combination of materials, or a multilayer stack of a material 304 and a material 306, without departing from the scope of the present disclosure.

In this aspect of the present disclosure, the third material 302 may be a Co/Ni multilayer stack having a number of periods. The third material may use the same materials as the materials used in the second SAF layer 112, or different materials, or provide a different arrangement of the first layer 202 and the second layer 204. By using the third material 302, the first SAF layer 108 can further tune the PMA and the damping constant provided by the SAF structure 124 in the structure 300.

Further, the third material 302 may allow for the use of different materials, or the arrangement of the materials, in the SAF coupling layer 110 and/or the second SAF layer 112. For example, using a Co/Pt multilayer stack of materials coupled to a Co/Ni multilayer stack of materials in the first SAF layer 108 may provide a first damping constant and a first PMA value. The application for a device employing the structure 300 may specify that the PMA value is maintained, or may specify that the damping constant is reduced with respect to proximity from the barrier layer 116. As such, different materials, or a smaller number of periods 212, may be used in the second SAF layer 112 or the SAF coupling layer 110 to provide the desired damping constant and the desired PMA value for the SAF structure 124. The use of the Co/Ni multilayer stack as the third material 302 may also change the thickness and/or the material used for the SAF coupling layer 110.

Figure 4:
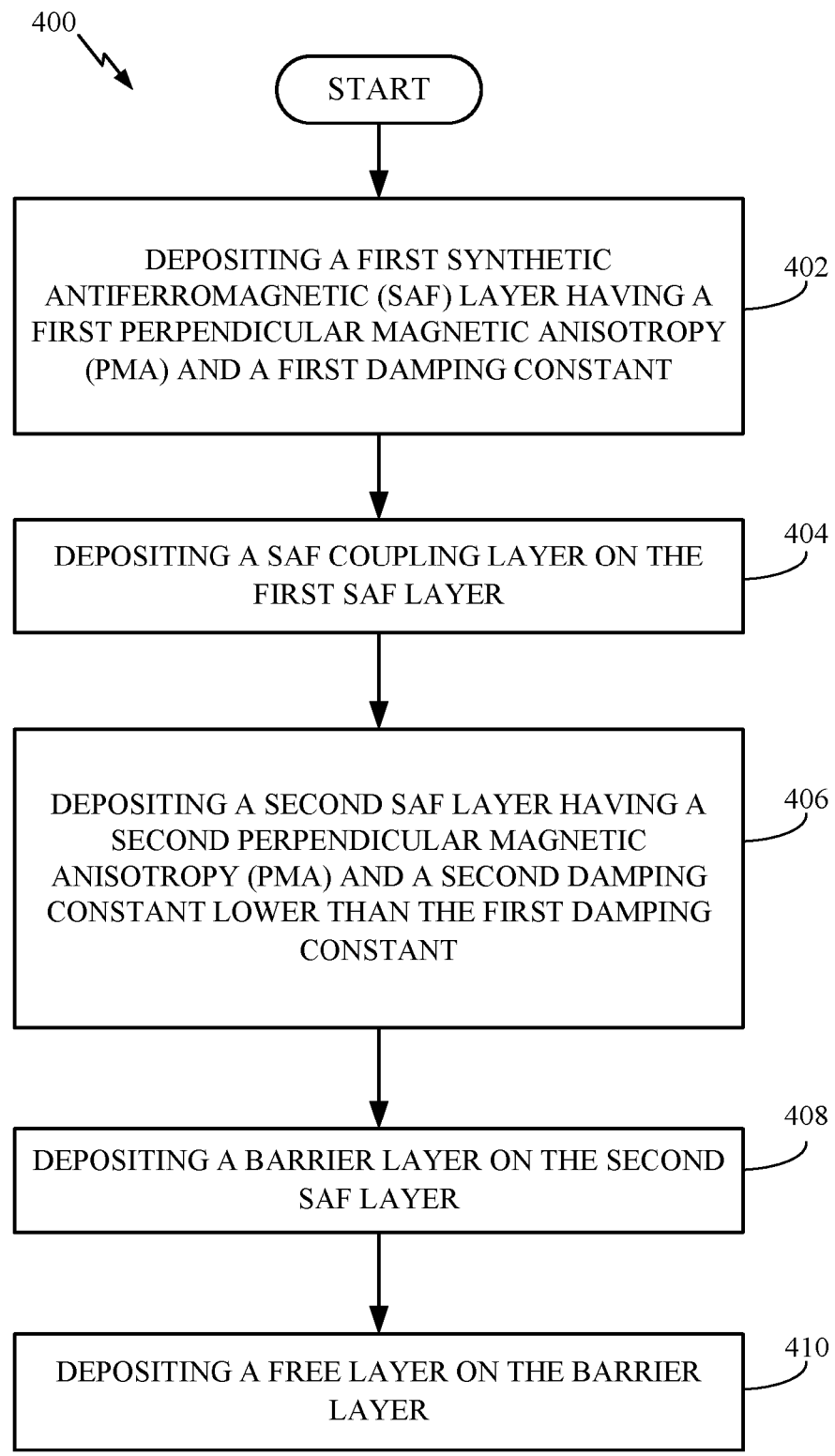
FIG. 4 is a process flow diagram illustrating one or more aspects of the present disclosure.

FIG. 4 is a process flow diagram illustrating a method 400 of forming a hybrid synthetic antiferromagnetic (SAF) layer for perpendicular magnetic tunnel junction (pMTJ) device according to one aspect of the present disclosure. At process block 402, a first synthetic antiferromagnetic (SAF) multilayer is deposited. The first SAF multilayer has a first perpendicular magnetic anisotropy (PMA) and a first damping constant. At process block 404, a SAF coupling layer is depositing on the first SAF layer. For example, as shown in FIG. 1, the SAF coupling layer 110 is depositing on the first SAF layer 108. At block 406 a second SAF multilayer is deposited on the SAF coupling layer. The second SAF multilayer has a second perpendicular magnetic anisotropy (PMA) and a second damping constant lower than the first damping constant. For example, as shown in FIG. 1, the second SAF layer 112 is deposited on the SAF coupling layer 110. At process block 408 a barrier layer is deposited on the second SAF multilayer. At process block 410, a free layer is deposited on the barrier layer. For example, as shown in FIG. 1, a free layer 118 is deposited on the barrier layer 116, which is disposed on the second SAF layer 112.

In one configuration, a magnetic tunnel junction (MTJ) device includes a free layer, a barrier layer, and a fixed layer. The fixed layer includes means for providing a first perpendicular magnetic anisotropy (PMA) and a first damping constant. In an aspect, the providing means may be the first SAF layer 108. The fixed layer also includes means for providing a second perpendicular magnetic anisotropy (PMA) and a second damping constant. In an aspect, this providing means may be the second SAF layer 112. The fixed layer also includes means for coupling the first and the second providing means. In an aspect, the coupling means may be the SAF coupling layer 110. In another aspect, the aforementioned means may be any structure or arrangement configured to perform the functions recited by the aforementioned means.

Figure 5:
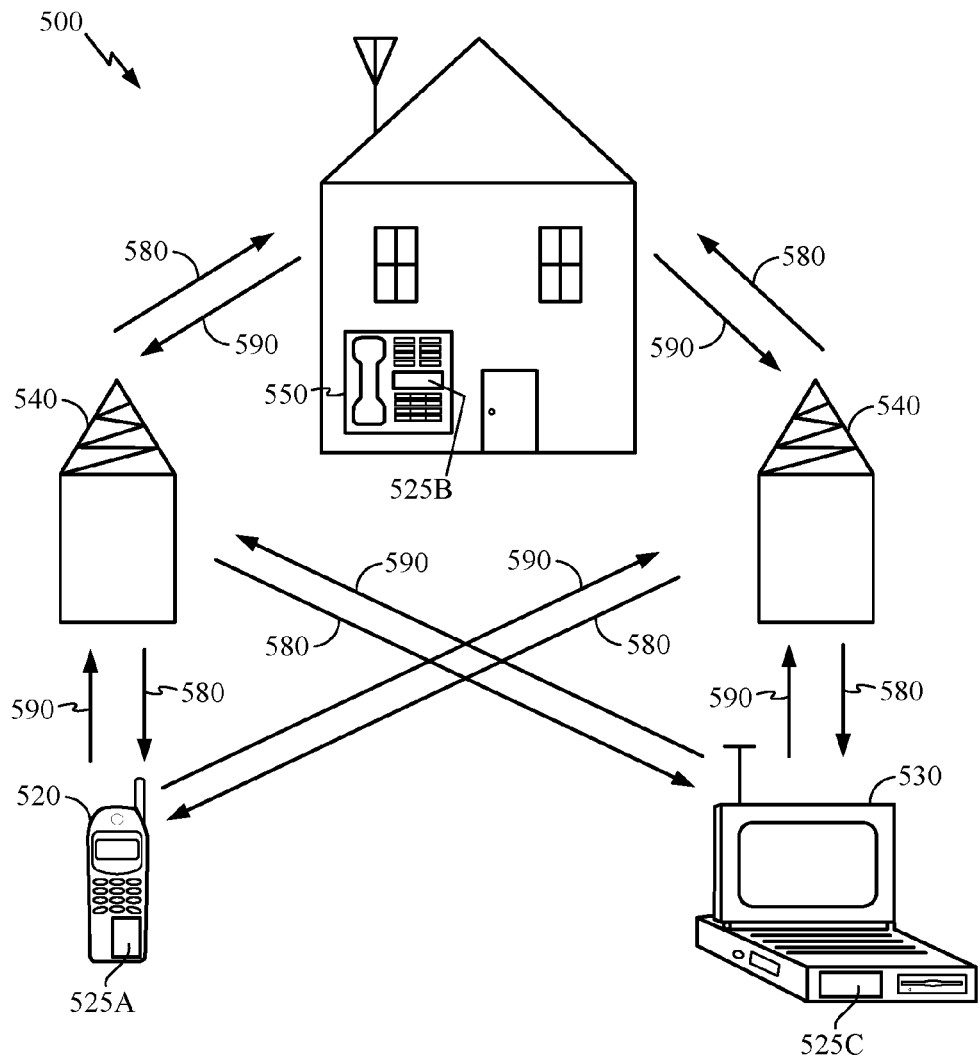
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed pMTJ devices. It will be recognized that other devices may also include the disclosed pMTJ devices, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed pMTJ devices.

Figure 6:
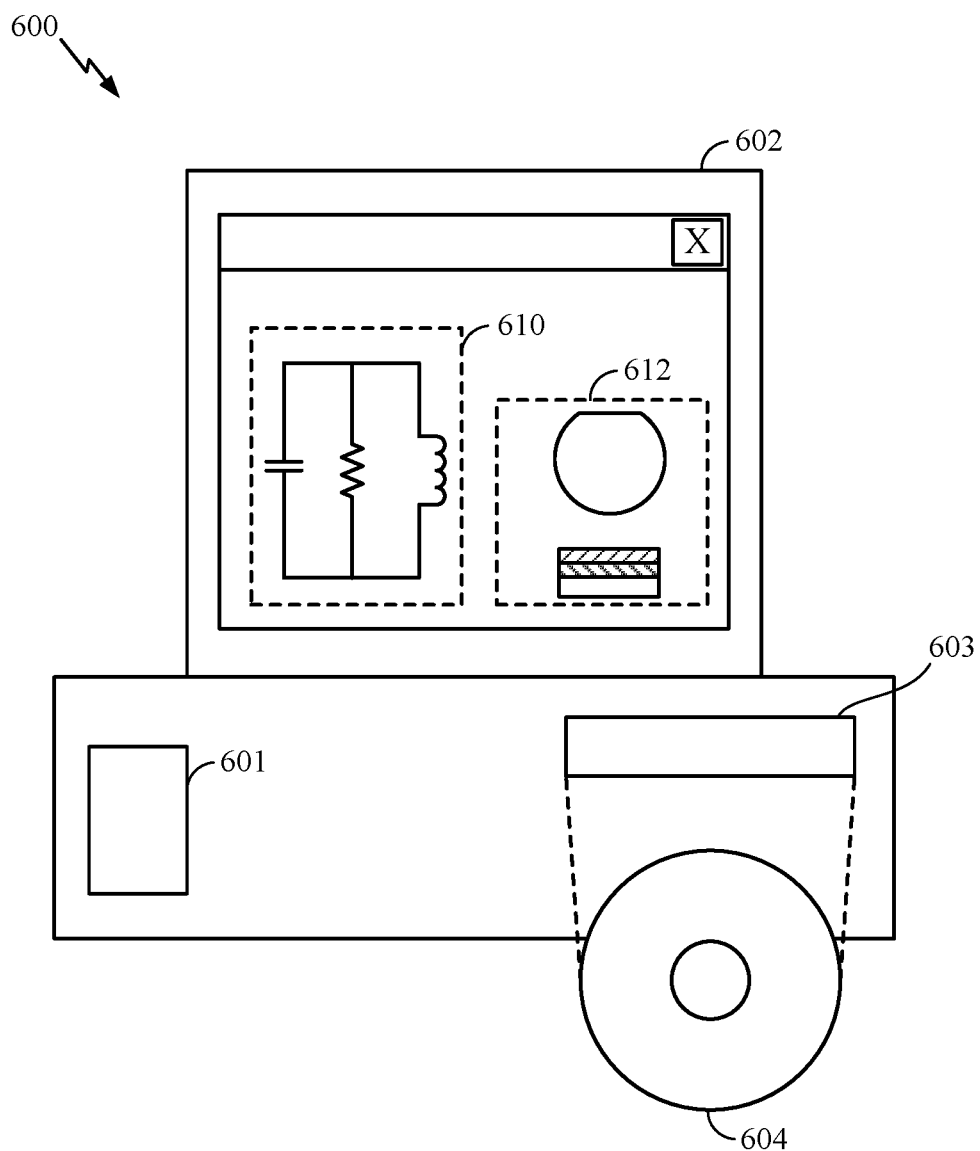
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the pMTJ devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a pMTJ device. A storage medium 604 is provided for tangibly storing the design of the circuit 610 or the semiconductor component 612. The design of the circuit 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the semiconductor component 612 by decreasing the number of processes for designing semiconductor wafers.

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. A computer-readable medium may include, by way of example, memory such as a magnetic storage device (e.g., hard disk, floppy disk, magnetic strip), an optical disk (e.g., compact disc (CD), digital versatile disc (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, or a removable disk. Although memory is shown separate from the processors in the various aspects presented throughout this disclosure, the memory may be internal to the processors (e.g., cache or register).

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of fabricating a magnetic tunnel junction (MTJ) device, comprising:
   depositing a first synthetic antiferromagnetic (SAF) multilayer having a first perpendicular magnetic anisotropy (PMA) and a first damping constant, the first SAF multilayer comprising a first multilayer stack of a first material layer and a second material layer arranged in a first alternating pattern;
   depositing a SAF coupling layer on the first SAF multilayer;
   depositing a second SAF multilayer having a second perpendicular magnetic anisotropy (PMA) and a second damping constant lower than the first damping constant, the second SAF multilayer comprising a second multilayer stack of the first material layer and a third material layer arranged in a second alternating pattern;
   depositing a barrier layer on the second SAF multilayer; and
   depositing a free layer on the barrier layer.

2. The method of claim 1, in which the second perpendicular magnetic anisotropy (PMA) is lower than the first PMA.

3. The method of claim 1, in which the first SAF multilayer comprises a cobalt platinum multilayer stack.

4. The method of claim 1, in which the second SAF multilayer comprises a cobalt nickel multilayer stack.

5. The method of claim 1, in which the first SAF multilayer comprises a cobalt platinum multilayer stack and a cobalt nickel multilayer stack, and the second SAF multilayer comprises a cobalt nickel multilayer stack.

6. The method of claim 1, further comprising integrating the MTJ device into a mobile phone, a set top box, a music player, a video player, an entertainment unit, a navigation device, a computer, a hand-held personal communication systems (PCS) unit, a portable data unit, and/or a fixed location data unit.

7. A method of fabricating a magnetic tunnel junction (MTJ) device, comprising:
   the step for depositing a first synthetic antiferromagnetic (SAF) multilayer having a first perpendicular magnetic anisotropy (PMA) and a first damping constant, the first SAF multilayer comprising a first multilayer stack of a first material layer and a second material layer arranged in a first alternating pattern;
   the step for depositing a SAF coupling layer on the first SAF multilayer;
   the step for depositing a second SAF multilayer having a second perpendicular magnetic anisotropy (PMA) and a second damping constant lower than the first damping constant, the second SAF multilayer comprising a second multilayer stack of the first material layer and a third material layer arranged in a second alternating pattern;
   the step for depositing a barrier layer on the second SAF multilayer; and
   the step for depositing a free layer on the barrier layer.

8. The method of claim 7, in which the second perpendicular magnetic anisotropy (PMA) is lower than the first PMA.

9. The method of claim 7, in which the first SAF multilayer comprises a cobalt platinum multilayer stack.

10. The method of claim 7, in which the second SAF multilayer comprises a cobalt nickel multilayer stack.

11. The method of claim 7, in which the first SAF multilayer comprises a cobalt platinum multilayer stack and a cobalt nickel multilayer stack, and the second SAF multilayer comprises a cobalt nickel multilayer stack.

12. The method of claim 7, further comprising integrating the MTJ device into a mobile phone, a set top box, a music player, a video player, an entertainment unit, a navigation device, a computer, a hand-held personal communication systems (PCS) unit, a portable data unit, and/or a fixed location data unit.

13. A method of fabricating a magnetic tunnel junction (MTJ) device, comprising:
depositing a hybrid first synthetic antiferromagnetic (SAF) multilayer structure having a first perpendicular magnetic anisotropy (PMA) and a first damping constant, the hybrid first SAF multilayer structure comprising a first multilayer stack of a first material layer and a second material layer arranged in a first alternating pattern, and a second multilayer stack of the first material layer and a third material layer, arranged in a second alternating pattern;
depositing a SAF coupling layer on the hybrid first SAF multilayer structure; and
depositing a second SAF multilayer stack having a second perpendicular magnetic anisotropy (PMA) and a second damping constant lower than the first damping constant.

14. The method of claim 13, further comprising:
depositing a reference layer on the second SAF multilayer stack;
depositing a barrier layer on the reference layer; and
depositing a free layer on the barrier layer.

15. The method of claim 14, in which, the second SAF multilayer stack is arranged closer to the barrier layer than the hybrid first SAF multilayer structure.

16. The method of claim 13, in which the second perpendicular magnetic anisotropy (PMA) is lower than the first PMA.

17. The method of claim 13, in which the first multilayer stack of the hybrid first SAF multilayer structure comprises a cobalt platinum multilayer stack.

18. The method of claim 13, in which the second SAF multilayer stack comprises a cobalt nickel multilayer stack.

19. The method of claim 13, in which the first multilayer stack of the hybrid first SAF multilayer structure comprises a cobalt platinum multilayer stack and the second multilayer stack of the hybrid first SAF multilayer structure comprises a cobalt nickel multilayer stack, and the second SAF multilayer stack comprises a cobalt nickel multilayer stack.

20. The method of claim 13, further comprising integrating the MTJ device into a mobile phone, a set top box, a music player, a video player, an entertainment unit, a navigation device, a computer, a hand-held personal communication systems (PCS) unit, a portable data unit, and/or a fixed location data unit.

* * * * *